United States Patent
Neogi et al.

(10) Patent No.: US 9,666,488 B1
(45) Date of Patent: May 30, 2017

(54) PASS-THROUGH CONTACT USING SILICIDE

(71) Applicant: GLOBALFOUNDRIES Inc., Grand Cayman (KY)

(72) Inventors: Tuhin Guha Neogi, Clifton Park, NY (US); David Pritchard, Glenville, NY (US); Scott Luning, Albany, NY (US); Guillaume Bouche, Albany, NY (US); David Doman, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/095,612

(22) Filed: Apr. 11, 2016

(51) Int. Cl.
*H01L 21/00* (2006.01)
*H01L 27/00* (2006.01)
*H01L 29/00* (2006.01)
*H01L 21/8238* (2006.01)
*H01L 21/84* (2006.01)
*H01L 21/285* (2006.01)
*H01L 27/092* (2006.01)
*H01L 27/12* (2006.01)
*H01L 29/08* (2006.01)
(Continued)

(52) U.S. Cl.
CPC ............... *H01L 21/823814* (2013.01); *H01L 21/28518* (2013.01); *H01L 21/823864* (2013.01); *H01L 21/823871* (2013.01); *H01L 21/84* (2013.01); *H01L 27/092* (2013.01); *H01L 27/1203* (2013.01); *H01L 29/0847* (2013.01); *H01L 29/161* (2013.01); *H01L 29/165* (2013.01); *H01L 29/7838* (2013.01); *H01L 29/7848* (2013.01)

(58) Field of Classification Search
CPC ..... H01L 21/823814; H01L 21/823864; H01L 21/84; H01L 21/28518; H01L 21/823871; H01L 27/092; H01L 27/1203; H01L 27/088; H01L 29/7848; H01L 29/0847; H01L 29/161; H01L 29/165; H01L 29/7838
See application file for complete search history.

(56) References Cited

U.S. PATENT DOCUMENTS

| | | | |
|---|---|---|---|
| 7,683,428 B2 * | 3/2010 | Chidambarrao | H01L 29/78642 257/302 |
| 7,700,993 B2 * | 4/2010 | Cai | G11C 16/0433 257/313 |

(Continued)

*Primary Examiner* — Nikolay Yushin
(74) *Attorney, Agent, or Firm* — Ditthavong & Steiner, P.C.

(57) ABSTRACT

A method of forming a silicide layer as a pass-through contact under a gate contact between p-epilayer and n-epilayer source/drains and the resulting device are provided. Embodiments include depositing a semiconductor layer over a substrate; forming a pFET gate on a p-side of the semiconductor layer and a nFET gate on a n-side of the semiconductor layer; forming a gate contact between the pFET gate and the nFET gate; forming raised source/drains on opposite sides of each of the pFET and nFET gates; and forming a metal silicide over a first raised source/drain on the p-side and over a second raised source/drain on the n-side, wherein the metal silicide extends from the first raised source/drain to the second raised source/drain and below the gate contact between the pFET and nFET gates.

20 Claims, 12 Drawing Sheets

(51) Int. Cl.
*H01L 29/161* (2006.01)
*H01L 29/165* (2006.01)
*H01L 29/78* (2006.01)

(56) References Cited

U.S. PATENT DOCUMENTS

| | | | |
|---|---|---|---|
| 2009/0114971 A1* | 5/2009 | Cai .................... | G11C 16/0433 257/315 |
| 2009/0200604 A1* | 8/2009 | Chidambarrao .. | H01L 29/66787 257/329 |
| 2015/0091093 A1* | 4/2015 | Bouche ............ | H01L 29/41725 257/369 |
| 2015/0270222 A1* | 9/2015 | Alptekin ........... | H01L 29/41766 257/288 |

* cited by examiner

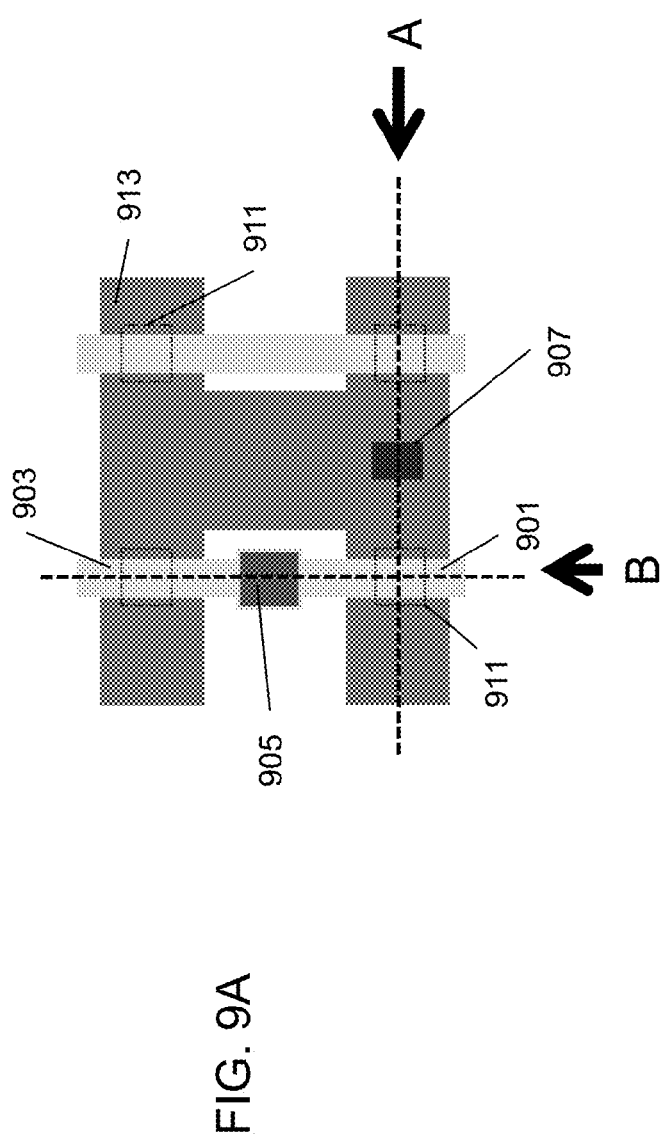
FIG. 9A
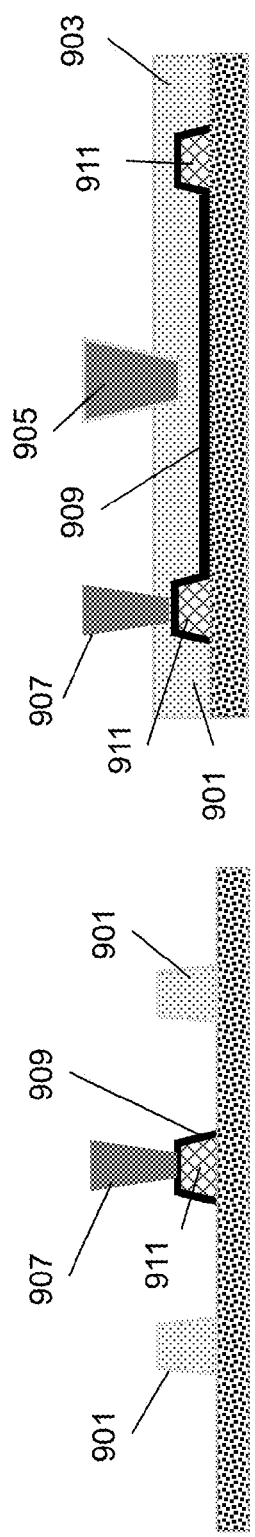
FIG. 9C
FIG. 9B

PASS-THROUGH CONTACT USING SILICIDE

TECHNICAL FIELD

The present disclosure relates to semiconductor layouts. In particular, the present disclosure relates to a pass-through contact between p-epilayer and n-epilayer source/drains in a semiconductor device.

BACKGROUND

Existing standard cell library constructs provide competitive cell area and density. Among those cell library constructs is a pass-through contact used in more advanced technology nodes. As technology continues to produce smaller semiconductor devices, the spacing between middle-of-line (MOL) layers decreases. This leads to congestion of MOL and back-end-of-the-line (BEOL) layers, such as metal 1 (M1) to gate contact (CB) spacing in fully depleted silicon-on-insulator (FD-SOI) technology, source/drain contact (CA) to CB spacing for 20 low power mobile (LPM) computing applications, or trench silicide (TS) to CB spacing in 20 LPM computing applications. Also, in order to meet spacing requirements for manufacturability and reliability, other design rules such as CB to gate (PC) contact are compromised.

M1 to CB spacing in a current FD-SOI is 40 nm (minimum rule). This limits laterally flipping the cells for the library design which leads to M1 congestion. M1 jogs are also required, and this introduces corner rounding and leads to M1 congestion as well. Further, with 20 LPM computing applications a CB offset is used which reduces CB-PC contact area, and there is a risk of an open CB-PC, which leads to a high risk construct. With 20 LPM computing applications a CA was used instead of M1, and the CA needs to be narrow to enable this library construct for production level.

A need therefore exists for methodology enabling the formation of a pass-through contact that helps reduce MOL congestion without compromising design rules, and the resulting device.

SUMMARY

An aspect of the present disclosure is to provide a silicide layer as a pass-through contact under a gate contact between p-epilayer and n-epilayer source/drains. Another aspect of the present disclosure is to provide a continuous silicide pass-through contact under a gate contact between p-epilayer and n-epilayer source/drains and over a thin silicon layer.

Yet another aspect of the present disclosure is to provide, in FD-SOI technology, a silicide layer that acts as a pass-through contact under a gate contact between p-epilayer and n-epilayer source/drains. This aspect is unique to FD-SOI technology, as compared to conventional bulk technology, and as a result the wells are isolated by a BOX layer and no electrical shorting arises.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including depositing a semiconductor layer over a substrate; forming a pFET gate on a p-side of the semiconductor layer and a nFET gate on a n-side of the semiconductor layer; forming a gate contact between the pFET gate and the nFET gate; forming raised source/drains on opposite sides of each of the pFET and nFET gates; and forming a metal silicide over a first raised source/drain on the p-side and over a second raised source/drain on the n-side, wherein the metal silicide extends from the first raised source/drain to the second raised source/drain and between the pFET gate and the nFET gate.

Aspects of the present disclosure include forming a first contact over the first raised source/drain, the first raised source/drain including a p-epilayer. Other aspects include forming a second contact over the second raised source/drain, the second raised source/drain including a n-epilayer. Another aspect includes the first and second contacts including tungsten, copper or titanium. Further aspects include depositing a silicon-on-insulator (SOI) structure over a buried oxide and forming the metal silicide below the gate contact between the pFET gate and the nFET gate. Another aspect includes the metal silicide including tungsten silicide, titanium silicide, nickel silicide or copper silicide. Further aspects include forming a mask over the n-side of the substrate and etching a spacer of the pFET gate, wherein the first raised source/drain includes a p-type epilayer. Yet other aspects include forming a mask over the p-side of the substrate and etching a spacer of the nFET gate, wherein the second raised source/drain includes an n-type epilayer. Other aspects include forming the metal silicide over the p-type epilayer and n-type epilayer. Further aspects include the metal silicide extending below the gate contact between the pFET gate and the nFET gate. Other aspects include forming a metal silicide on a single RX mask. Yet other aspects include forming a metal silicide layer on two RX masks. Further aspects include the nFET gate spacer and the pFET gate spacer including silicon nitride (SiN). Yet another aspect includes removing the SiN with reactive ion etching (RIE) to prior to forming the metal silicide over the p-type epilayer and n-type epilayer.

Another aspect of the present disclosure is a device including a semiconductor layer over a substrate; a pFET gate on a p-side of the semiconductor layer and a nFET gate on a n-side of the semiconductor layer; a gate contact formed between the pFET gate and the nFET gate; raised source/drain on opposite sides of each of the pFET and nFET gates; and a metal silicide formed over a first raised source/drain on the p-side and over a second raised source/drain on the n-side, wherein the metal silicide extends from the first raised source/drain to the second raised source/drain and below the gate contact between the pFET gate and nFET gate.

Aspects include the semiconductor layer including a SOI structure metal silicide being formed below the gate contact and above the SOI structure. Other aspects include the metal silicide including tungsten silicide, titanium silicide, nickel silicide or copper silicide. Further aspects include the metal silicide extending from the first raised source/drain to the second raised source/drain and below the gate contact between the pFET gate and the nFET gate. Other aspects include a first contact formed over the first raised source/drain, the first raised source/drain including a p-epilayer; and a second contact formed over the second raised source/ drain, the second raised source/drain including a n-epilayer, wherein the first and second contacts include tungsten, copper or titanium.

According to the present disclosure, other technical effects may be achieved in part by a method including depositing a semiconductor layer over a substrate; forming a pFET gate on a p-side of the semiconductor layer and a nFET gate on a n-side of the semiconductor layer; forming a gate contact between the pFET gate and the nFET gate; forming raised source/drains on opposite sides of each of the pFET and nFET gates; forming a mask over the n-type side of the substrate and etching a spacer of the pFET; forming a mask over the p-type side of the substrate and etching a spacer of the nFET; forming a metal silicide over a first raised source/drain contact in the p-side and over a second raised source/drain contact in the n-side, wherein the metal silicide extends from the first raised source/drain contact to the second raised source/drain contact and below the gate contact between the pFET and nFET gates; forming a first contact over the first raised source/drain, the first raised source/drain including a p-epilayer; and forming a second contact over the second raised source/drain, the second raised source/drain including a n-epilayer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 12 schematically illustrate cross sectional views of a process flow to produce a silicide pass-through contact in a semiconductor device, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of congestion of MOL and BEOL layers in advanced library constructs such as pass-through contacts without compromising design rules of CB-PC contact.

Methodology in accordance with embodiments of the present disclosure includes depositing a semiconductor layer over a substrate; forming a pFET gate on a p-side of the semiconductor layer and a nFET gate on a n-side of the semiconductor layer; forming a gate contact over at least one of the pFET gate and the nFET gate; forming raised source/drains on opposite sides of each of the pFET and nFET gates; and depositing a metal silicide over a first raised source/drain on the p-side and over a second raised source/drain on the n-side, wherein the metal silicide extends from the first raised source/drain to the second raised source/drain and below the at least one gate contact.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
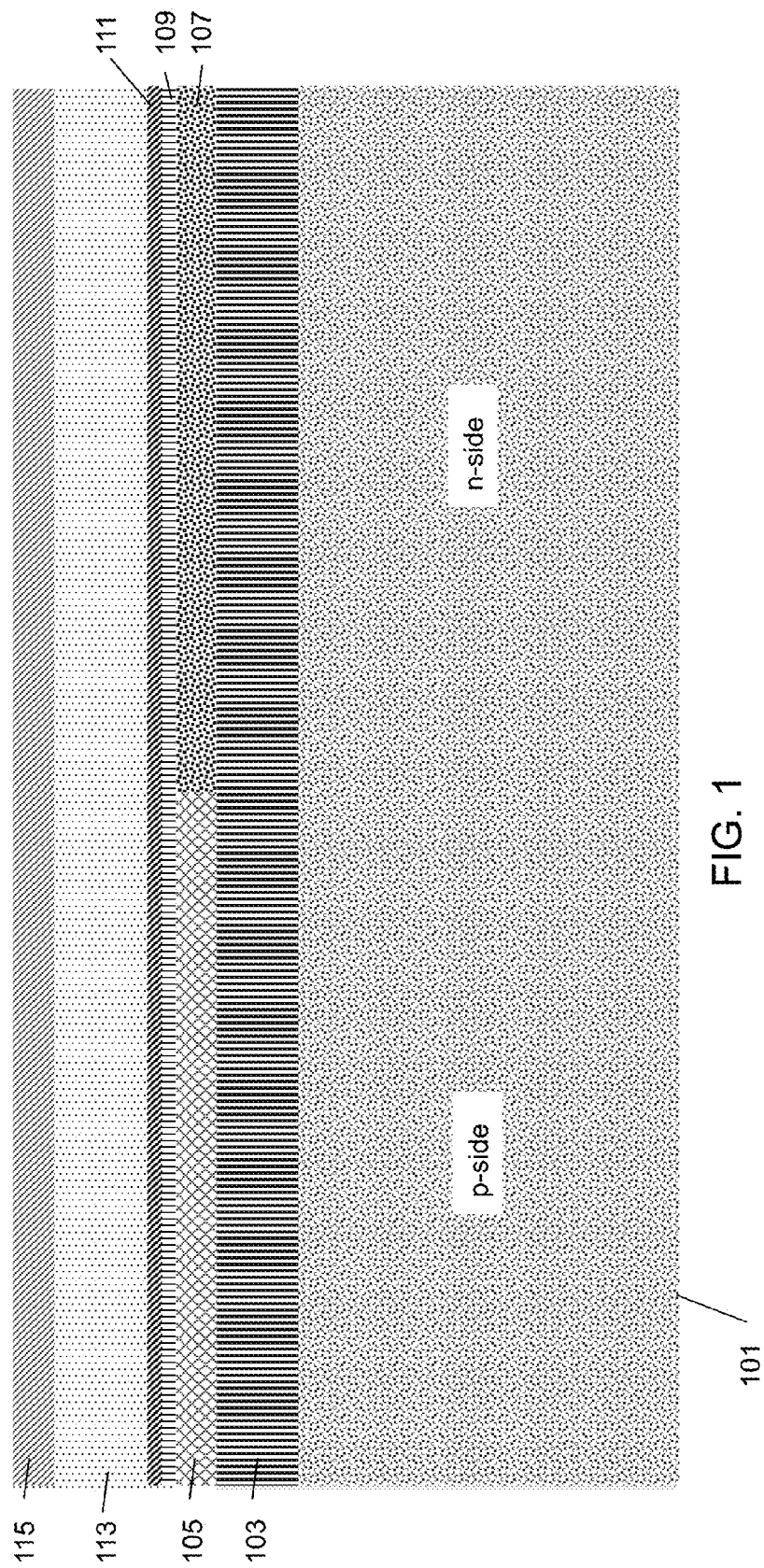

Adverting to FIG. 1, a semiconductor structure is shown in cross section. The semiconductor structure includes a substrate 101 with a semiconductor layer disposed on the substrate 101. The semiconductor structure includes a p-side and a n-side, which are labeled in FIG. 1. The substrate 101 may represent any appropriate carrier material, and the semiconductor layer may form a FD-SOI configuration, or alternatively the semiconductor layer may be formed in the bulk of the substrate 101. An FD-SOI configuration is shown in FIG. 1 and includes a buried oxide (BOX) layer 103 disposed over the substrate 101. The semiconductor layer 105 is located on the PFET side and semiconductor layer 107 is located on the p-side. Semiconductor layer 105 is formed of a condensed semiconductor alloy including a condensed silicon germanium (SiGe) layer. Semiconductor layer 107 is formed of a silicon including a monocrystalline silicon. The semiconductor layer 105, which includes the condensed SiGe layer, applies a predetermined stress to the channel region of the P-channel field effect transistor (FET), wherein a compressive strain component is known to advantageously increase the mobility of holes in the channel region.

Gate material 113 on the p-side will be for a pFET, and the gate material 113 on the n-side will be for an nFET used in complementary metal-oxide semiconductor (CMOS) technology. Gate material 113 includes a semiconductor such as a polysilicon. The gate structure in this example is formed according to gate-first, high-k/metal gate (HKMG) technology. The gate-stack formation may be performed using standard 28 nm processing.

Gate insulating layer 109 includes a high-k material. High-k refers to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like. Gate metal layer 111 is formed over the gate insulating layer 109, and the gate material 113 is formed on the gate metal layer 111. The gate metal layer 111 may include a metal such as tantalum or tungsten. The gate metal layer 111 can also include a nitride such as, for example, titanium nitride (TiN) or tantalum nitride (TaN). A certain percentage of a work function metal species, such as aluminum and the like, may be included in the gate metal layer 111, in combination with other materials. On the upper surface of the gate material 113 is a hard mask 115.

Figure 2:
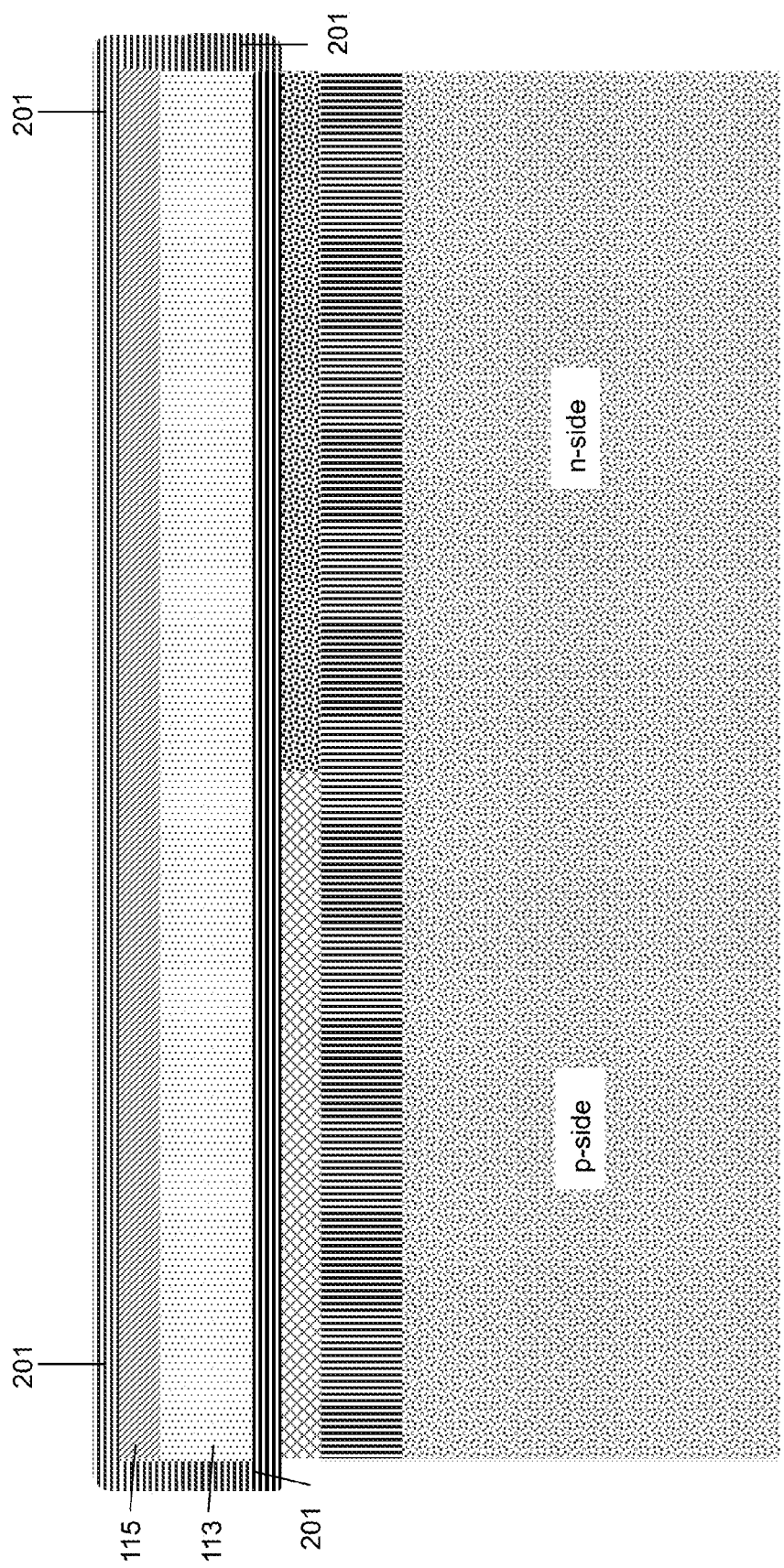

Adverting to FIG. 2, gate spacer 201, on both the p-side and n-side, is formed on or adjacent sidewalls of the gate material 113 of the gate structure. The gate spacer 201 also carries out the task of protecting sensitive materials included in the gate stack, such as, for example, the materials included in the gate metal layer 111. Gate spacer 201 is formed of a nitride material including SiN.

Figure 3:
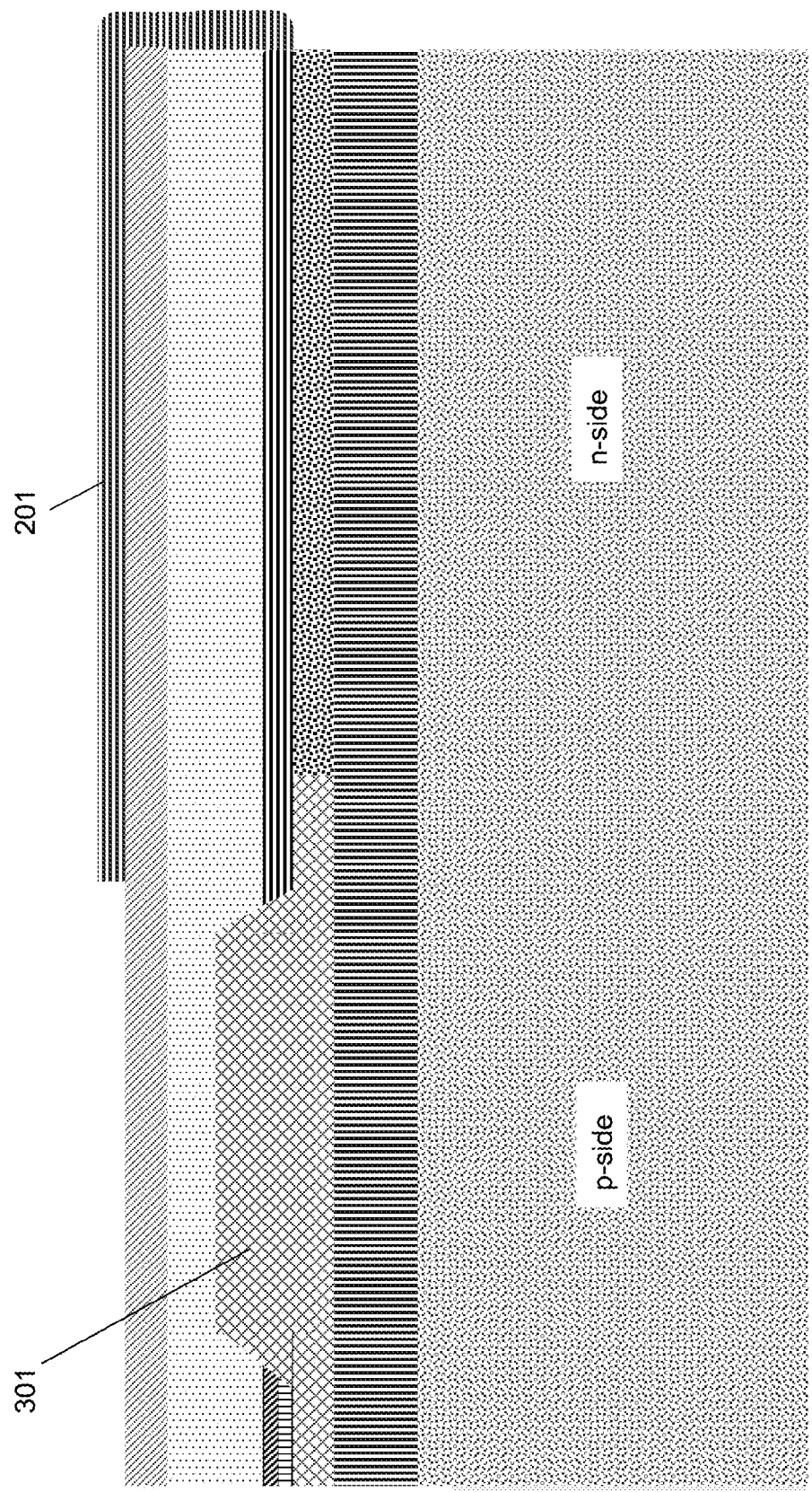

Adverting to FIG. 3, a pFET spacer etch is performed to remove a portion of the gate spacer material on the p-side active area of the semiconductor layer 105 to form pFET spacers, while the n-side is masked (not shown). During the pFET spacer etching, only a small amount of SOI (e.g., less than 1 nanometer) is removed. Following the pFET spacer etch, a p-epilayer 301 is then grown over the semiconductor layer 105 to formed raised source/drains on opposite sides of the pFET gate. The raised source region serves the conventional function of carrying carriers into the channel region of pFET gate, and the raised drain region serves the conventional function of injecting carriers out of pFET gate. The p-epilayer 301 can be doped between $10^{18}$ and $10^{21}$ atoms/cm$^3$. The p-epilayer 301 may, for example, be in situ doped to $10^{19}$ atoms/cm$^3$ with p-type dopants. The p-epilayer region extends above the surface of semiconductor layer 105 on opposites sides of the pFET gate, as illustrated in FIG. 3.

Figure 4:
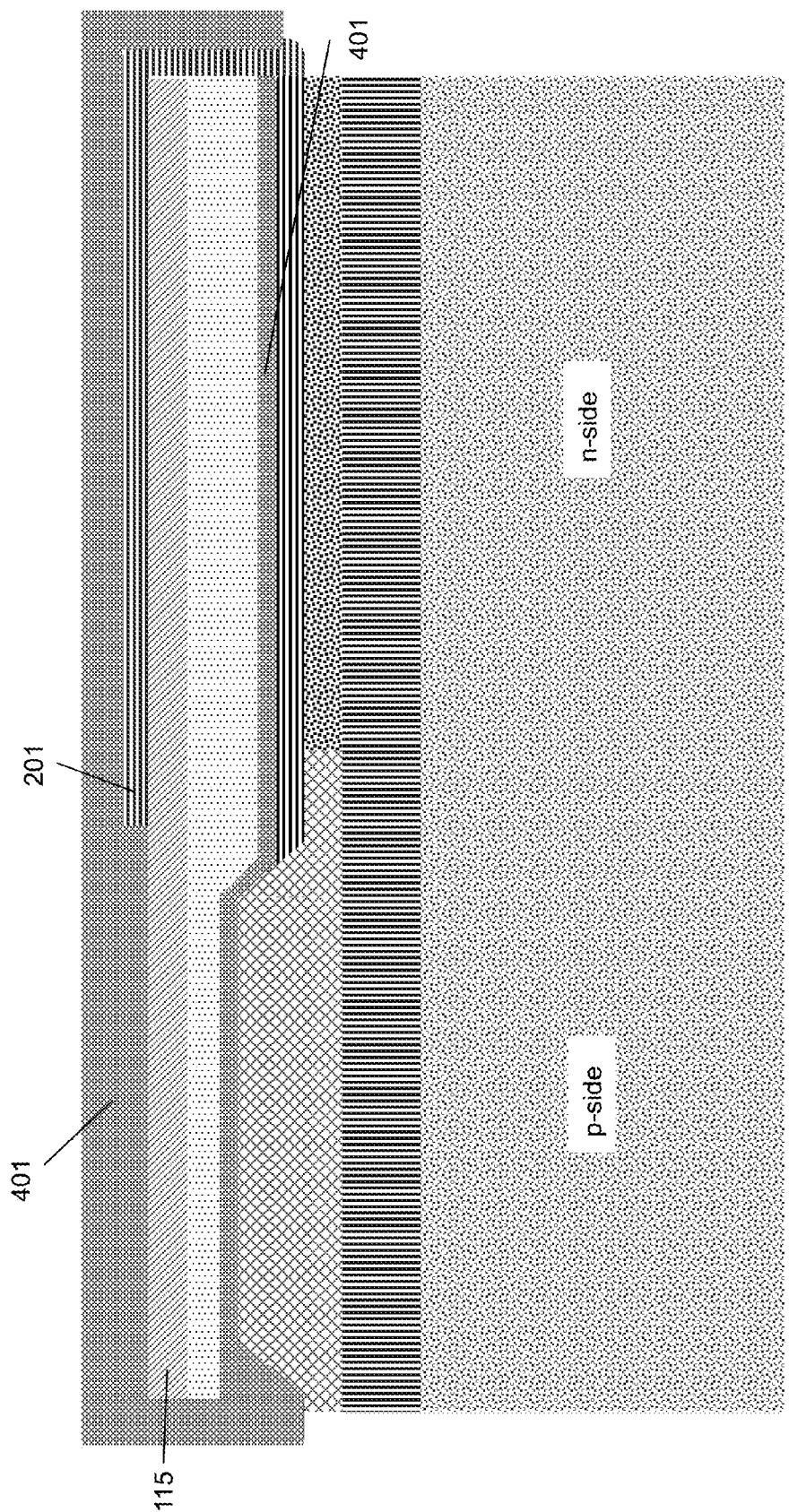

Adverting to FIG. 4, gate spacer 401 on the p-side and on the n-side is formed on sides of the pFET and nFET. Gate spacer 401 is formed of a nitride material including SiN. The gate spacer 401 on the n-side is deposited over the gate spacer 201 which was previously masked during the pFET spacer etch shown in FIG. 3. The gate spacer 401 on the p-side is deposited over the hard mask 115.

Figure 5:
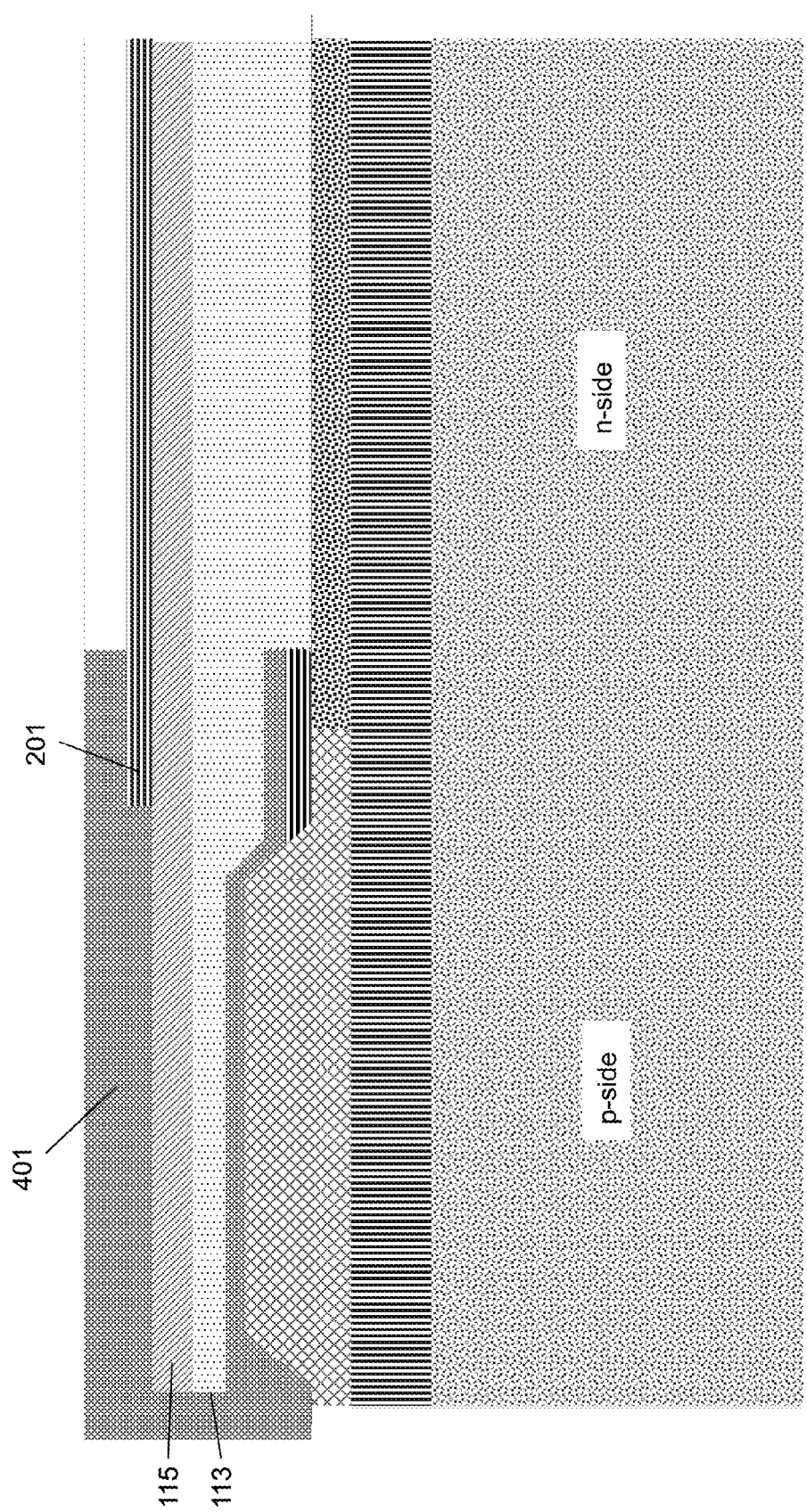

In FIG. 5, an nFET spacer etch is performed to remove the gate spacer 403 on the n-side, while the p-side is masked (not shown). An overlap portion of the spacer material is formed between the p-epilayer and the to be formed n-epilayer. During the nFET spacer etching, only a small amount of silicon is removed. A reactive ion etching (RIE) process can be used to remove the gate spacer 403.

Figure 6:
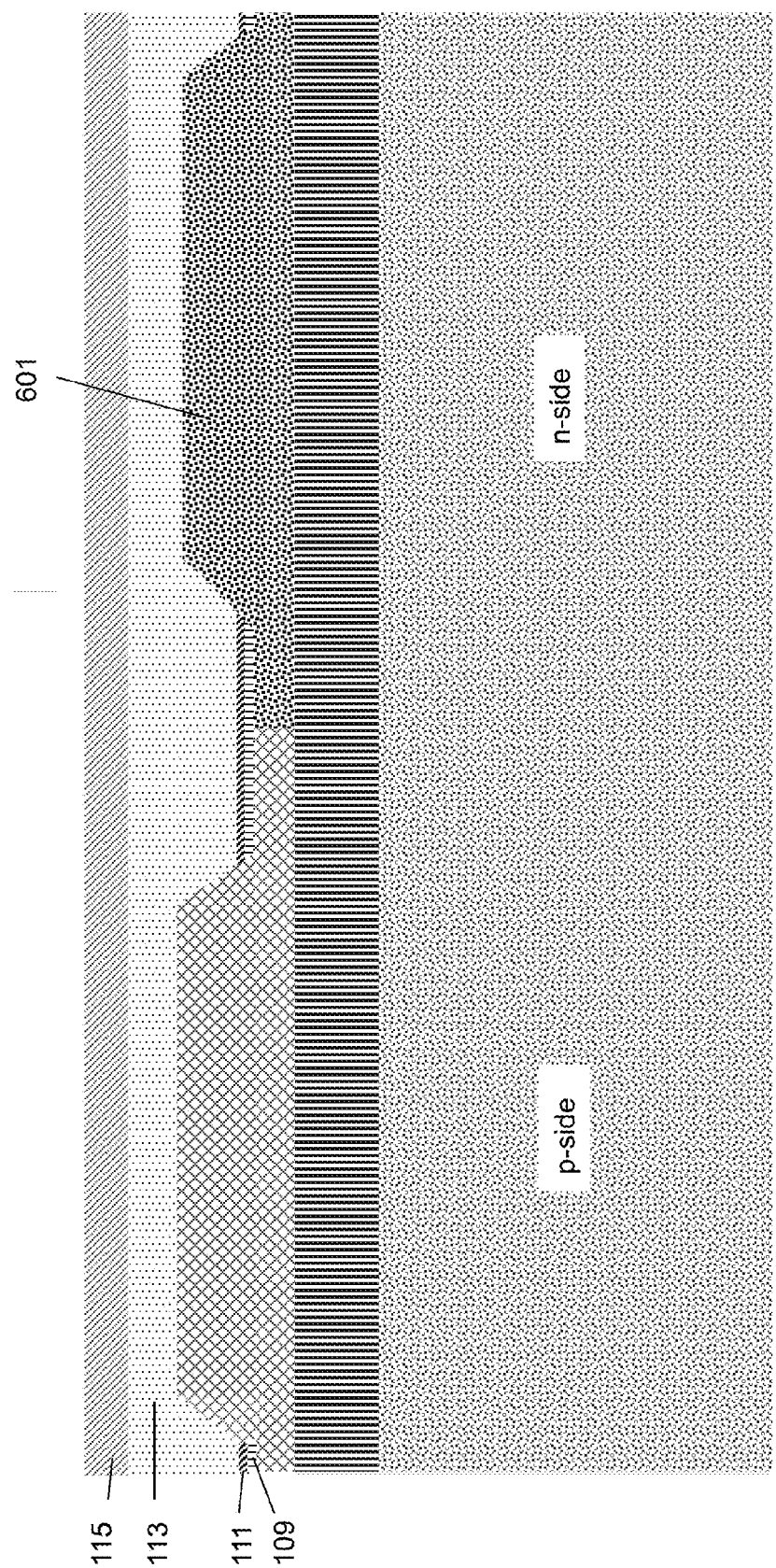

In FIG. 6, n-epilayer 601 is then grown over the semiconductor layer 107 to form raised source/drains on opposite sides of the nFET gate. The n-epilayer 601 can be doped between $10^{19}$ and $10^{21}$ atoms/cm$^3$. The n-epilayer 501 may, for example, be in situ doped to $10^{19}$ atoms/cm$^3$ with n-type dopants. The n-epilayer region extends above the surface of semiconductor layer 107 on opposites sides of the nFET gate, as illustrated in FIG. 6. In FIG. 6, the portions of the nitride layer that had been previously masked are shown removed by RIE processing.

Figure 7:
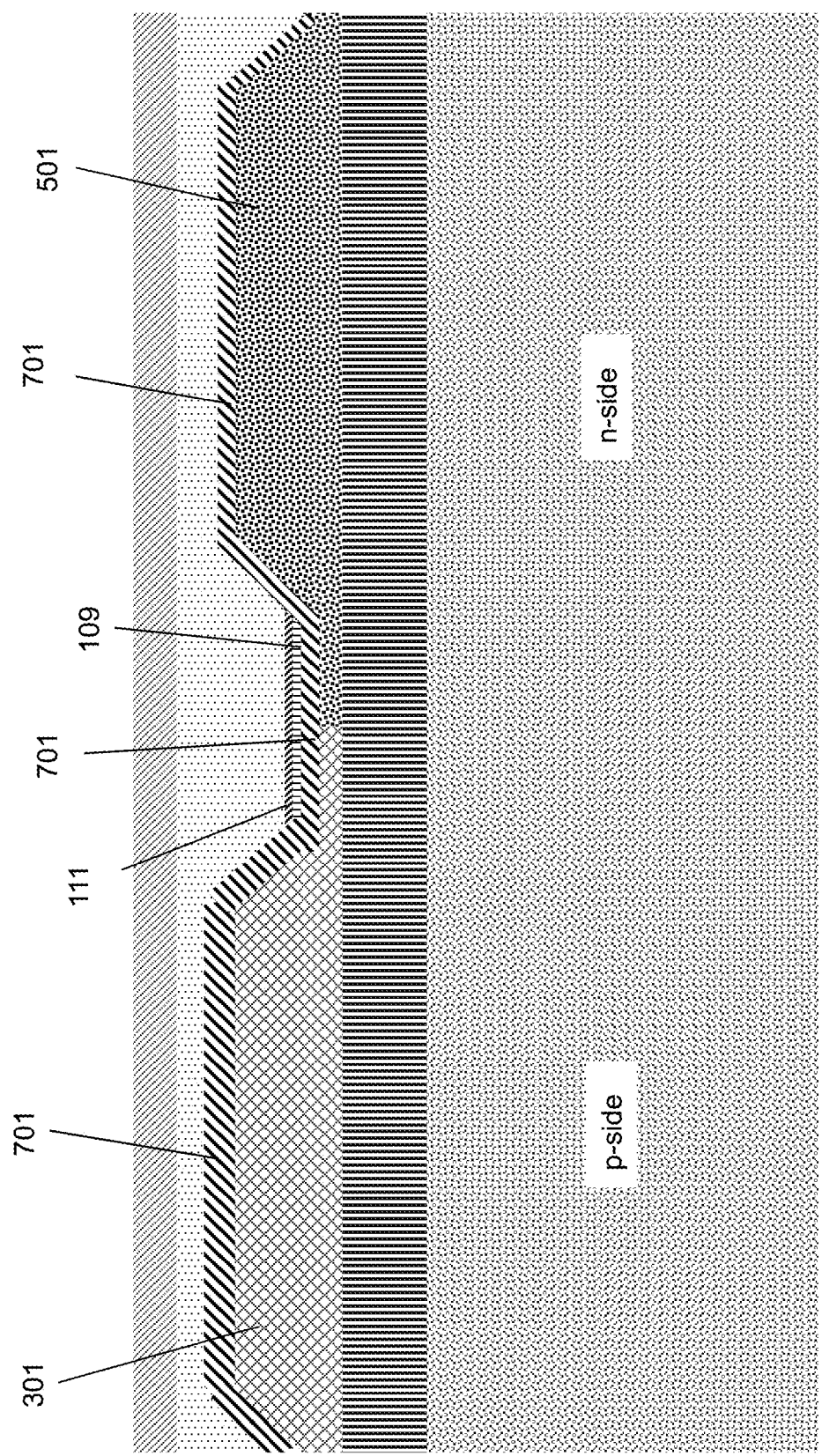

Adverting to FIG. 7, a metal silicide layer 701 is formed during a silicidation process over the p-epilayer 301, n-epilayer 501 and the silicon between the p-epilayer 301 and n-epilayer 501. The metal silicide layer 701 extends from the raised source/drain on the p-side to a raised source/drain on the n-side. The metal silicide 701 includes tungsten silicide (WSi), titanium silicide (TiSi), nickel silicide (NiSi), or copper silicide (CuSi). The thickness of the metal silicide layer 701 and the parameters of the subsequent heat treatment, such as the temperature and the heating time, are chosen so as to obtain a desired thickness of the metal silicide layer 701. For example, the thickness of the metal silicide 701 on the p-side ranges from 5 to 10 nm, and the thickness of the metal silicide 701 on the n-side ranges from 5 to 10 nm.

Figure 8:
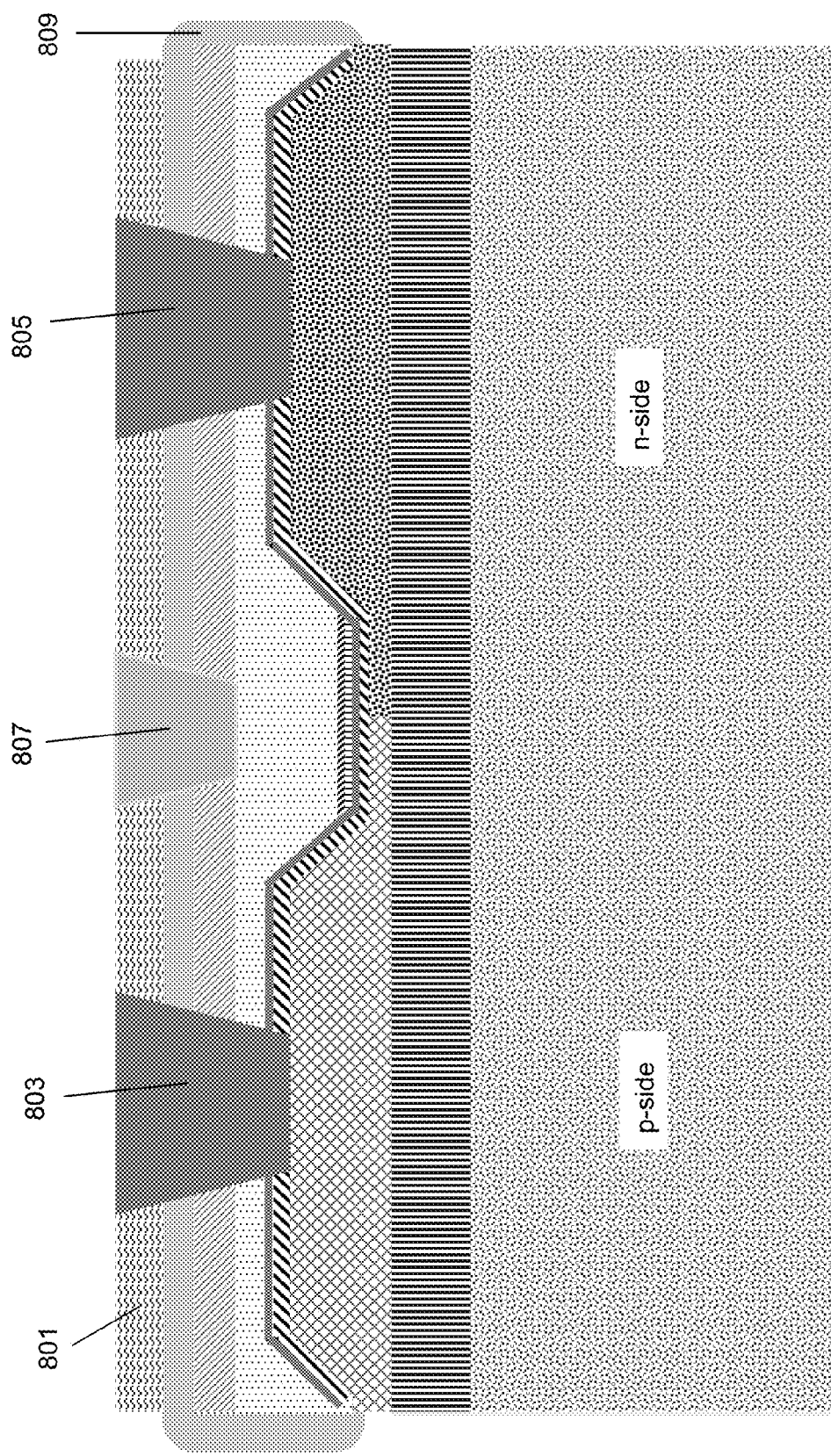

Adverting to FIG. 8, an interlayer dielectric layer (ILD) 801 is deposited and the ILD layer 801 typically includes an oxide. For example, the ILD layer 801 includes silicon dioxide. After being deposited, the ILD layer 801 is preferably back-etched and planarized. This may be achieved by using a chemical mechanical planarization (CMP). Patterning exposes contact holes followed by an etching process is then performed to form openings (not shown), permitting electrical contact to the source/drain regions and the pFET and n-FET gates, respectively. Etching is preferably anisotropic. For example, etching may include a plasma-enhanced etch. A patterned mask may be used during the etching process in order to open openings in predetermined positions of the exposed surface of the ILD 801. The mask is generally removed after carrying out the etching process. Etching is calibrated so as to stop at the surface of the metal silicide layer 701 over the p-epilayer 301 and n-epilayer 501. After forming openings, these are filled by a material having a high electrical conductivity. The material typically includes a highly conductive metal. For example, the material may include one or more metals such as aluminum, copper, tungsten, silver, gold and the like. Highly conductive contact material may also include a metal alloy.

The filled openings form a contact 803 over the p-epilayer 301 and another contact 805 over the n-epilayer 501. Thus, contacts 801 and 805 are formed over the raised source/drain on p-side and n-side, respectively, to create an electrical contact to the source/drain regions. Gate contact 807 is formed between the pFET gate and the nFET gate to create an electrical contact to the pFET and/or n-FET gate. Sidewall spacers 809 are shown formed on the sidewalls of pFET and nFET gate structures. The silicide layer 601 provides a contact between the pFET gate and the nFET gate to pass under the gate contact (without offset) using one or more masks.

Adverting to FIG. 9A, a simplified top view of the semiconductor structure described above is shown. In particular, this top view shows a pFET gate 901 and nFET gate 903 are formed. A gate contact 905 is formed between the nFET gate 903 and the pFET gate 901, and a contact 907 is formed over a raised source/drain region disposed. In FIG. 9B, which is a cross section view along directional arrow A of FIG. 9A, a metal silicide layer 909 covers the surfaces of the raised source/drain 911, and a contact 907 is formed over the raised source/drain 911. As shown in FIG. 9C, which is a vertical cross-sectional view along directional arrow B in FIG. 9A, the metal silicide 909 provides a contact to pass-through a gate contact 905 (without offset) using a single mask 913 (FIG. 9A).

Figure 10:
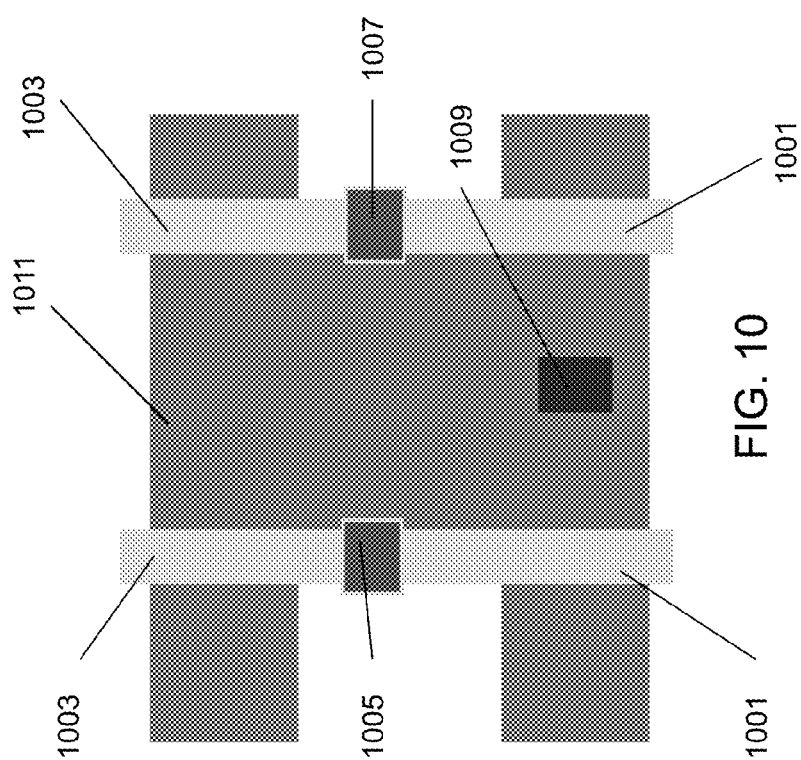

Adverting to FIG. 10, a simplified top view of the semiconductor structure described above is shown. In this particular example, the top view shows a pFET gates 1001, 1001 and nFET gates 1003, 1003 are formed. A gate contact 1005 is formed between pFET gate 1001 and a nFET gate 1003. Gate contact 1007 is formed between pFET gate 1001 and a nFET gate 1003. A contact 1009 is formed over a raised source/drain region. A metal silicide (not shown) is formed on a single RX pattern with a single mask 1011 and provides a contact to pass under the gate contact 1005 formed between the pFET gate 1001 and nFET gate 1003.

Figure 11:
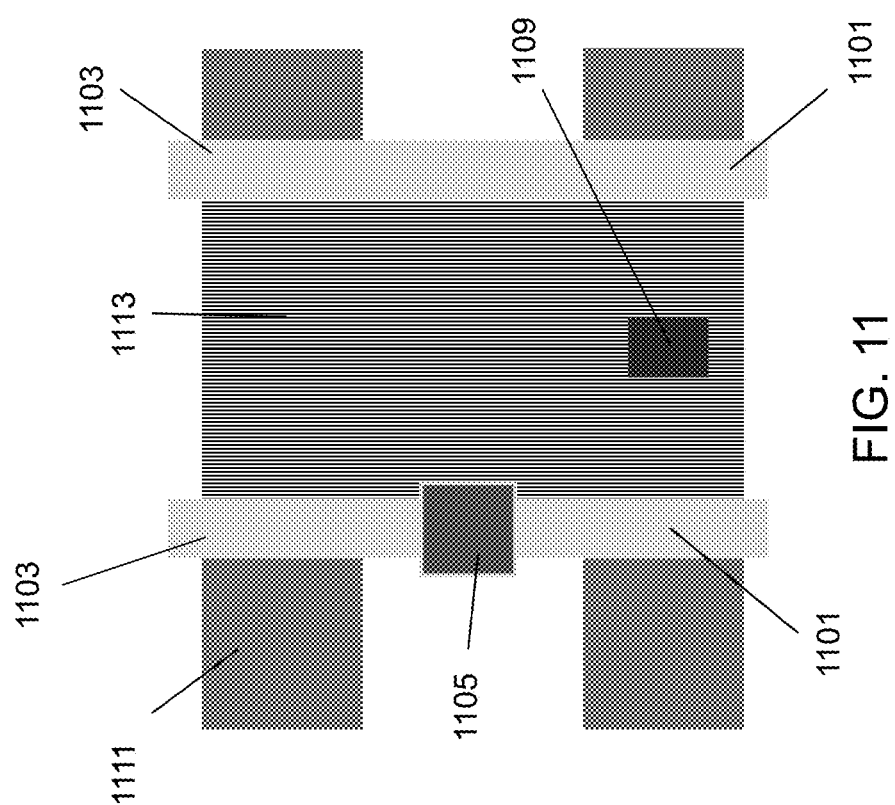

Adverting to FIG. 11, a simplified top view of the semiconductor structure described above is shown. In particular, this top view shows a pFET gates 1101, 1101 and nFET gates 1103, 1103 are formed. A gate contact 1105 is formed between the pFET gate 1101 and nFET 1103. Contact 1109 is formed between two pFET gates 1101, 1101 or two nFET gates 1103, 1103. The metal silicide (not shown) is formed on a double RX pattern with two RX masks 1111 and 1113, and provides a contact to pass under gate contact 1105 (without offset) between the pFET 1101 gate and nFET gate 1003 (without offset.

Figure 12:
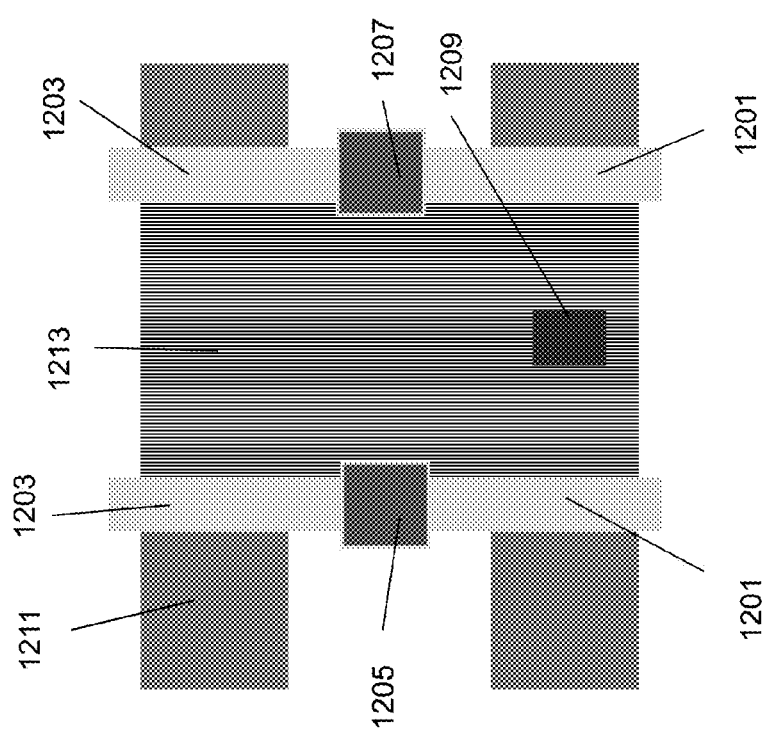

Adverting to FIG. 12, a simplified top view of the semiconductor structure described above is shown. In particular, this top view shows a pFET gates 1201, 1201 and nFET gate 1203, 1203 are formed. A gate contact 1205 is formed between pFET gate 1201 and nFET gate 1203. Contact 1209 is formed between two pFET gates 1201, 1201 or two nFET gates 1203, 1203. The metal silicide (not shown) is formed on a double RX pattern with two RX masks 1211 and 1213, and provides a contact to pass under gate contact 1205 between the pFET 1201 and nFET gate 1203 (without offset).

The embodiments of the present disclosure can achieve several technical effects, such as reducing MOL congestion without usage of multiple MOL layers and extra mask usage. Usage of conductive silicide alloys achieves connectivity between intended PMOS and NMOS source/drains. The present invention allows for the same construct to be used in consecutive pitches without missing a critical poly pitch (CCP) and, therefore, save cell area. The present invention further prevents any compromise in the design rules of CB to PC contact and improves yield, reliability and manufacturability.

Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using a silicide pass-through contact.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   depositing a semiconductor layer over a substrate;
   forming a pFET gate on a p-side of the semiconductor layer and a nFET gate on a n-side of the semiconductor layer;
   forming a gate contact between the pFET gate and the nFET gate;
   forming raised source/drains on opposite sides of each of the pFET and nFET gates; and
   forming a metal silicide over a first raised source/drain on the p-side and over a second raised source/drain on the n-side,
   wherein the metal silicide extends from the first raised source/drain to the second raised source/drain and below the gate contact between the pFET gate and the nFET gate.

2. The method according to claim 1, comprising:
   depositing a silicon-on-insulator (SOI) structure over a buried oxide; and
   depositing the metal silicide below the gate contact and between the pFET gate and the nFET gate.

3. The method according to claim 1, wherein the metal silicide comprises tungsten silicide, titanium silicide, nickel silicide or copper silicide.

4. The method according to claim 1, wherein:
   the metal silicide extends from the first raised source/drain to the second raised source/drain and below the gate contact between the nFET gate and the pFET gate.

5. The method according to claim 1, further comprising:
   forming a metal silicide on a single RX mask.

6. The method according to claim 1, further comprising:
   forming a metal silicide on two RX masks.

7. The method according to claim 1, further comprising:
   forming a first contact over the first raised source/drain, the first raised source/drain comprising a p-epilayer.

8. The method according to claim 7, comprising:
   forming a second contact over the second raised source/drain, the second raised source/drain comprising a n-epilayer.

9. The method according to claim 8, wherein the first and second contacts comprise tungsten, copper or titanium.

10. The method according to claim 1, further comprising:
    forming a mask over the n-side of the substrate and etching a spacer of the pFET gate,
    wherein the first raised source/drain comprises a p-type epilayer.

11. The method according to claim 10, further comprising:
    forming a mask over the p-side of the substrate and etching a spacer of the nFET gate,
    wherein the second raised source/drain comprises a n-type epilayer.

12. The method according to claim 11, comprising depositing the metal silicide over the p-type epilayer and n-type epilayer.

13. The method according to claim 11, wherein the nFET gate spacer and the pFET gate spacer comprise SiN.

14. The method according to claim 13, further comprising:
    removing the SiN with reactive ion etching (RIE) to prior to forming the metal silicide over the p-type epilayer and n-type epilayer.

15. A device comprising:
    a semiconductor layer over a substrate;
    a pFET gate on a p-side of the semiconductor layer and a nFET gate on a n-side of the semiconductor layer;
    a gate contact formed between the pFET gate and the nFET gate;
    raised source/drain on opposite sides of each of the pFET and nFET gates; and
    a metal silicide formed over a first raised source/drain on the p-side and over a second raised source/drain on the n-side,
    wherein the metal silicide extends from the first raised source/drain to the second raised source/drain and below the gate contact between the pFET and nFET.

16. The device according to claim 15, wherein:
    the metal silicide extends from the first raised source/drain to the second raised source/drain and below the gate contact between the pFET gate and the nFET gate.

17. The device according to claim 15, further comprising:
    a first contact formed over the first raised source/drain, the first raised source/drain comprising a p-epilayer; and
    a second contact formed over the second raised source/drain, the second raised source/drain comprising a n-epilayer,
    wherein the first and second contacts comprise tungsten, copper or titanium.

18. The device according to claim 15, wherein:
    the semiconductor layer comprises a silicon-on-insulator (SOI) structure, and the metal silicide is formed below the gate contact and above the SOI structure.

19. The device according to claim 18, wherein the metal silicide comprises tungsten silicide, titanium silicide, nickel silicide or copper silicide.

20. A method comprising:
depositing a semiconductor layer over a substrate;
forming a pFET gate on a p-side of the semiconductor layer and a nFET gate on a n-side of the semiconductor layer;
forming a gate contact between the pFET gate and the nFET gate;
forming raised source/drains on opposite sides of each of the pFET and nFET gates;
forming a mask over the n-type side of the substrate and etching a spacer of the pFET;
forming a mask over the p-type side of the substrate and etching a spacer of the nFET;
forming a metal silicide over a first raised source/drain contact in the p-side and over a second raised source/drain contact in the n-side, wherein the metal silicide extends from the first raised source/drain contact to the second raised source/drain contact and below the gate contact formed between the pFET and nFET gates;
forming a first contact over the first raised source/drain, the first raised source/drain comprising a p-epilayer; and
forming a second contact over the second raised source/drain, the second raised source/drain comprising a n-epilayer.

* * * * *